United States Patent [19]

Sato et al.

[11] Patent Number: 5,284,912

[45] Date of Patent: Feb. 8, 1994

[54] THERMOSET RESIN WITH POLYUNSATURATED MONOMER-GRAFTED SEED PARTICLES

[75] Inventors: Hozumi Sato; Yasuhiro Yoshida; Tatuaki Matunaga, all of Tokyo, Japan

[73] Assignee: Japan Synthetic Rubber Co., Ltd., Tokyo, Japan

[21] Appl. No.: 41,338

[22] Filed: Apr. 1, 1993

Related U.S. Application Data

[63] Continuation of Ser. No. 744,920, Aug. 14, 1991, abandoned.

[30] Foreign Application Priority Data

Aug. 16, 1990 [JP] Japan ................................. 216837

[51] Int. Cl.$^5$ .................... C08L 51/04; C08L 63/02; C08L 61/10; C08L 61/28
[52] U.S. Cl. .............................. 525/65; 525/66; 525/68; 525/69; 523/407; 523/501
[58] Field of Search ............ 525/65, 66, 68, 69, 525/315; 523/407, 501

[56] References Cited

U.S. PATENT DOCUMENTS

| | | | |
|---|---|---|---|
| 3,856,883 | 12/1974 | Dickie et al. | 525/66 |
| 4,082,895 | 4/1978 | Backderf et al. | 525/67 |
| 4,252,912 | 2/1981 | Tokas | 525/315 |
| 4,287,106 | 9/1981 | Forgo et al. | 525/315 |
| 4,300,972 | 11/1981 | Neubert | 524/300 |
| 4,778,851 | 10/1988 | Henton et al. | 525/65 |

FOREIGN PATENT DOCUMENTS

| | | | |
|---|---|---|---|
| 0683228 | 3/1964 | Canada | 525/315 |
| 0706441 | 3/1965 | Canada | 525/315 |
| 62-22850 | 1/1987 | Japan . | |
| 62-104888 | 5/1987 | Japan . | |

*Primary Examiner*—Robert E. Sellers
*Attorney, Agent, or Firm*—Oliff & Berridge

[57] ABSTRACT

A thermosetting resin composition comprising fine particles of an elastomer component homogeneously dispersed in a thermosetting resin is disclosed. The elastomer component comprises a rubbery copolymer prepared from a monomer mixture capable of producing a copolymer having a glass transition point of 25° C. or lower and containing at least one crosslinking monomer having at least two unsaturated bonds in the molecule in the presence of seed polymer particles which are comprised of a polymer having a glass transition point of 25° C. or lower. The possesses excellent impact resistance, mechanical strength, and adhesive strength. It is suitably used as a sealing material of semiconductors, an adhesive for print circuit boards, a molding material, a paint, and a lining material.

7 Claims, 1 Drawing Sheet

THERMOSET RESIN WITH POLYUNSATURATED MONOMER-GRAFTED SEED PARTICLES

This is a Continuation of application Ser. No. 07/744,920 filed Aug. 14, 1991, now abandoned.

BACKGROUND OF THE INVENTION

1. Field of the Invention

The present invention relates to a thermosetting resin composition comprising fine particles of an elastomer component homogeneously dispersed in a thermosetting resin.

2. Description of the Background Art

A disadvantage of thermosetting resins such as phenol resins, epoxy resins, melamine resins, urea resins, polyimide resins, and the like is their brittleness which offsets their excellent mechanical strength. A strong desire therefore existed for the development of molded articles of thermosetting resins with greater impact resistance and adequate flexibility.

One proposal for providing thermosetting resins with more flexibility is blending rubber with them. A known example of such a mixture of rubber and a thermosetting resin is a mixture of butadiene-acrylonitrile copolymer and phenol resin. The use of rubbers with functional groups in order to provide reactivity with epoxy resins has been studied and reported by a number of publications, e.g., Japanese Patent Publication No. 30133/1982. The studies heretofore undertaken, however, dealt with compositions containing thermosetting resins and rubbers having polarities close to each other and thus having a greater mutual solubilities. Products with satisfactory mechanical strength can be obtained by blending a thermosetting resin and a rubber having a good mutual solubility. Such products, however, have a defect in their decreased fluidity, which impairs moldability of the thermosetting resin compositions. Another problem is that the mixture must be blended with a great care so as to ensure adequate dispersion of rubbers throughout thermosetting resins.

In order to improve the dispersibility of rubbers in thermosetting resin compositions the present inventors previously proposed the use of rubbers crosslinked by polyfunctional monomers (Japanese Patent Laid-open (ko-kai) No. 228562/1985). This method, however, could not improve the fluidity of thermosetting resin compositions.

Japanese Patent Laid-open (ko-kai) No. 22850/1987 discloses a thermosetting resin composition comprising an epoxy resin and fine particles of rubber covered with a resin having a glass transition point above room temperature. Since such resins with a glass transition point above room temperature do not contribute to the improvement in the impact strength, the resulting thermosetting resin composition possesses insufficient mechanical strength and rigidity.

Japanese Patent Laid-open (ko-kai) No. 53370/1987, on the other hand, discloses a process of dispersing rubbery particles in epoxy resin by polymerizing monomers which produces a polymer having a glass transition point lower than room temperature in the epoxy resin. The problem of this process is in the difficulty in controlling particle sizes of the rubbery particles with acceptable reproducibility because the sizes of rubbery particles are greatly affected by the stirring conditions, the temperature, and the like in the polymerization reaction.

Japanese Patent Laid-open (ko-kai) No. 91755/1983 discloses a process of producing an epoxy resin composition into which vulcanized rubber with a particle size of 0.5–30 $\mu$m is dispersed. In the process, a liquid rubber, which is insoluble in the epoxy resin, is first dispersed in the epoxy resin and then vulcanized. Controlling the rubber particle size with good reproducibility is, however, extremely difficult in this process. In addition, the process can only produce rubbery particles with a very wide particle size distribution.

U.S. Pat. No. 4,778,851 discloses a process for dispersing graft rubber particles in an epoxy resin. Dispersing graft rubber particles homogeneously in epoxy resin requires that the graft rubber particles be dispersed in water or dissolved in a solvent. The process does not provide epoxy resin compositions with sufficiently improved properties.

The present inventors have undertaken extensive studies in order to obtain a rubber-thermosetting resin composition without drawbacks mentioned above; a composition in which rubber particles with a uniform particle size are dispersed in a thermosetting resin and which exhibits superior flexibility, mechanical properties, fluidity, and moldability at the same time. As a result, the present inventors have found that a specific rubbery copolymer can satisfy these requirements when blended with a thermosetting resin in a certain proportion.

SUMMARY OF THE INVENTION

Accordingly, an object of this invention is to provide a thermosetting resin composition comprising: (a) 100 parts by weight of a thermosetting resin and (b) 1–100 parts by weight of a rubbery copolymer, wherein the rubbery copolymer (i) is a copolymer covering seed particles which are comprised of a polymer having a glass transition point of 25° C. or lower, said copolymer being prepared from a monomer mixture capable of producing a copolymer having a glass transition point of 25° C. or lower and containing at least one crosslinking monomer having at least two unsaturated bonds in the molecule in the presence of said seed polymer particles, (ii) has an average particle size of 0.2–1.0 $\mu$m, and (iii) has a gel proportion of 50% by weight or more.

In a preferred embodiment, said rubbery copolymer (b) is added to said thermosetting resin (a) while providing a shear force to the mixture in order to obtain a thermosetting resin composition in which rubbery copolymer particles with the same particle size as the latex particles produced when the copolymerization reaction is completed are dispersed in the thermosetting resin.

Accordingly, another object of the present invention is to provide a process for the preparation of a thermosetting resin composition comprising:

providing (a) a thermosetting resin and (b) a rubbery copolymer, wherein the rubbery copolymer (i) is a copolymer covering seed particles which are comprised of a polymer having a glass transition point of 25° C. or lower, said copolymer being prepared from a monomer mixture capable of producing a copolymer having a glass transition point of 25° C. or lower and containing at least one crosslinking monomer having at least two unsaturated bonds in the molecule in the presence of said seed polymer particles, (ii) has an average particle size of 0.2–1.0 $\mu$m, and (iii) has a gel proportion of 50% by weight or more, and adding 1-100 parts by weight of said rubbery copolymer (b) to 100 parts by weight of said thermosetting resin (a) while providing a shear force to the mixture.

Other and further objects, features and advantages of the invention will appear more fully from the following description.

BRIEF DESCRIPTION OF DRAWINGS

FIG. 1 is an electron microscope photograph showing structures of copolymer particles distributed in the epoxy resin composition prepared in Example 1.

DETAILED DESCRIPTION OF THE INVENTION AND PREFERRED EMBODIMENTS

A variety of thermosetting resins can be used as component (a) in the composition of the present invention. Such thermosetting resins include phenol resins, epoxy resins, melamine resins, urea resins, polyimide resins, unsaturated polyester resins, and the like.

Specific examples of phenol resins are novolac resins, resol resins, and modified novolac or resol resins. Composite resins such as phenol-modified melamine resins can also be used.

As examples of epoxy resins, bisphenol-type, novolac-type, and alicyclic-type epoxy resins, as well as modified epoxy resins, such as rubber-modified, urethane-modified, and brominated epoxy resins, can be given.

As a urea resin, various urea resins; cationic, non-ionic, and anionic urea resins, can be used.

As a melamine resin, either non-modified melamine resins or modified melamine resins; e.g., urea-melamine resins, may be used.

Polyimide resins which can be used include those produced by the reaction of tetracarboxylic acid or its anhydride and a diamine, maleimide-modified epoxy resins, and the like.

Typical examples of unsaturated polyester resins are those prepared from monomers containing two or more unsaturated bonds in a molecule, such as diallyl phthalate, diallyl maleate, and divinyl phthalate.

These thermosetting resins can be used either solely or in combination of two or more.

Among these thermosetting resins, phenol resins, epoxy resins, and unsaturated polyester resins are particularly preferable because of their easiness in processing together with rubbers and other materials by conventional closed-type kneaders, extruders, or rollers. Such thermosetting resins can provide a composition in which a rubbery copolymer of component (b) is finely dispersed.

In the present invention, a rubbery copolymer of component (b) can be prepared by using particles of polymer or copolymer having a glass transition point of 25° C. or lower, preferably 0° C. or lower, and particularly preferably −20° C. or lower, as seed particles, and by polymerizing a monomer mixture capable of producing a copolymer having a glass transition point of 25° C. or lower, preferably 0° C. or lower, and particularly preferably −20° C. or lower, and containing at least one crosslinking monomer having at least two unsaturated bonds in the molecule by emulsion polymerization (seed polymerization) in the presence of said seed polymer particles. The product thus obtained is in the form of particles with an average particle size of 0.2-1.0 μm, in which a part or whole of the seed particles are covered by the rubbery copolymer. Furthermore, the rubbery copolymer covering the seed particles must have a gel proportion of 50% by weight or more.

In the preparation of seed particles to be used in the above seed polymerization, a dispersion of seed particles (hereinafter referred to as "seed latex") may be prepared by dissolving a polymer which has a glass transition point of 25° C. or lower in a solvent and dispersing the polymer in water by using emulsifier and stirring by a stirrer such as a homogenizer. Use of a latex prepared by emulsion polymerization of monomers as the seed latex is more preferable for controlling the particle size of the resulting copolymer particles and from the aspect of a higher productivity.

The process for the production of rubbery copolymer particles of component (b) can be simplified by using a latex prepared by emulsion polymerization as a seed latex because this ensures consecutive operation of the polymerization steps. Thus, a preferable seed polymerization process comprises consecutive multiple steps; a first step of preparing a seed latex of a polymer or copolymer (collectively referred to as polymer) having a glass transition point of 25° C. or lower, and a second step of obtaining rubbery copolymer particles. In the second step a monomer mixture capable of producing a copolymer having a glass transition point of 25° C. or lower and containing at least one crosslinking monomer having at least two unsaturated bonds in the molecule is added to the seed latex, optionally, together with suitable additives. The addition of monomers to the reaction vessel in the first and/or second steps may be carried out either at one time or dividedly.

The rubbery copolymer particles of component (b) thus prepared must have an average particle size of 0.2-1.0 μm, and preferably 0.3-1.0 μm. If the average particle size is less than 0.2 μm, the resulting thermosetting resin composition has a high viscosity and low fluidity, impairing processability of the product, such as moldability, adhesiveness, and paintability. If the average particle size is greater than 1.0 μm, the dispersion of the rubbery copolymer particles in the resin composition is inadequate, rendering the impact resistance and mechanical strength to be insufficient.

In preparing rubbery copolymer particles having an average particle size of 0.2-1.0 μm, the polymerization must be carried out with an extremely small amount of emulsifier. Emulsion polymerization formulations containing an anionic emulsifier conventionally used in the production of synthetic rubbers do not produce rubbery copolymer particles having particle sizes of this range.

Component (b) is rubbery copolymer particles which are manufactured by using at least one crosslinking monomer with at least two unsaturated bonds in the molecule and have a gel proportion of 50% by weight or more, and preferably 80% by weight or more. If the gel proportion of component (b) is smaller than 50% by weight, it is difficult to produce a resin composition in which rubbery copolymer particles with the same particle size as the latex particles produced when the copolymerization reaction is completed are dispersed. In addition, component (b) with a gel proportion smaller than 50% by weight has a higher viscosity and can form a homogeneous blend with a thermosetting resin with difficulty. They do not produce a thermosetting resin composition with acceptable impact resistance and mechanical strength.

The gel proportion in the present invention is defined as the methyl ethyl ketone-insoluble residue. It is measured by putting 1 gm of accurately weighed rubbery copolymer particles into 100 ml of methyl ethyl ketone, allowing the mixture to stand still for 24 hours at room temperature, filtering it through a 30 mesh wire net, and drying and weighing the methyl ethyl ketone-insoluble residue. The percent by weight of the residue for the total copolymer represents the gel proportion of the rubbery copolymer particles.

Monomers which constitute component (b) include conjugated dienes (Monomer I), unsaturated compounds which do not have functional groups (Monomer II), unsaturated compounds which have functional groups (Monomer III), and crosslinking monomers.

Typical Monomer I compounds are butadiene, dimethylbutadiene, isoprene, chloroprene, and the like, as well as their derivatives.

Examples of Monomer II are (meth)acrylic acid esters, e.g., methyl (meth)acrylate, ethyl (meth)acrylate, propyl (meth)acrylate, butyl (meth)acrylate, hexyl (meth)acrylate, cyclohexyl (meth)acrylate, lauryl (meth)acrylate, polyethylene glycol (meth)acrylate, polypropylene glycol (meth)acrylate; hydroxyalkyl (meth)acrylate, or the like; alkoxy (meth)acrylate; e.g., methoxyethyl (meth)acrylate, ethoxyethyl (meth)acrylate; cyano group-containing compounds, e.g. acrylonitrile, methacrylonitrile, and the like; and other unsaturated compounds, such as olefins, e.g., ethylene, propylene, 1-butene, 2-butene, isobutene, 1-pentene; aromatic vinyl compounds; e.g., styrene, methylstyrene; and the like.

Given as examples of Monomer III are compounds with a carboxyl group as a functional group, such as (meth)acrylic acid, itaconic acid, maleic acid, fumaric acid, $\beta$-(meth)acryloxyethyl succinate, $\beta$-(meth)acryloxyethyl maleate, $\beta$-(meth)acryloxyethyl phthalate, $\beta$-(meth)acryloxyethyl hexahydrophthalate, and the like; compounds with an acid anhydride group as a functional group, such as maleic anhydride, succinic anhydride, and the like; compounds with an epoxy group as a functional group, such as glycidyl methacrylate, allyl glycidyl ether, and the like; compounds with an amino group as a functional group, such as dimethylamino (meth)acrylate, diethylaminoethyl (meth)acrylate, and the like; compounds with an amide group as a functional group, such as (meth)acryl amide, dimethyl(meth)acryl amide, and the like; compounds with a hydroxyl group as a functional group, such as hydroxyethyl (meth)acrylate, hydroxypropyl (meth)acrylate, and the like; compounds with an isocyanate group as a functional group, such as vinyl isocyanate, isocyanate ethyl (meth)acrylate, p-styryl isocyanate, and the like; and compounds with a phosphate group as a functional group, such as (meth)acryloxyethyl phosphate, and the like.

As crosslinking monomers, compounds having two or more polymerizable double bonds in a molecule, such as divinylbenzene, divinyl ether, diallyl phthalate, ethylene glycol di(meth)acrylate, and trimethylolpropane tri(meth)acrylate, are given.

In the preparation of the seed latex in the first step for preparing rubbery copolymer particles of component (b), any combination of monomers are suitably selected. Inclusion of Monomer I is preferable. Typical examples of the combinations are monomers from Monomer I, monomers from Monomer I and Monomer II, and monomers from Monomer III and crosslinking monomers. In any combination, it is essential that the resulting polymer have a glass transition point of 25° C. or lower, and preferably 0° C. or lower. In the same way, for the polymerization of the second step, monomers must be selected so as to produce copolymer having a glass transition point of 25° C. or lower, and preferably 0° C. or lower. For the second step, however, inclusion of crosslinking monomers is imperative. A preferred combination of monomers is from Monomer I and crosslinking monomers, with the additional incorporation of Monomer III being particularly preferable. The inclusion of Monomer III promotes the surface adhesion capability of the resulting rubbery copolymer particles of component (b) to component (a), and thus contributes to higher mechanical strength and impact resistance.

A preferable amount of crosslinking monomers used for the preparation of rubbery copolymer of component (b) is 0.5-5 parts by weight, and more preferably 1.0-4.0 parts by weight, per 100 parts by weight of rubbery copolymer particles. An amount smaller than 0.5 parts by weight does not provide an adequate crosslinking structure in the resulting rubbery copolymer particles, and thus does not ensure a sufficient dispersion of rubbery copolymer particles throughout thermosetting resins, rendering the characteristics of the resulting thermosetting resin composition inadequate. An amount of crosslinking monomers greater than 5 parts by weight, on the other hand, impairs the stability of the latex during the production.

A preferable amount of Monomer I used for the preparation of rubbery copolymer particles of component (b) is 30-80% by weight, and more preferably 35-70% by weight, of the rubbery copolymer covering the seed particles. If the amount of Monomer I is smaller than 30% by weight, the resulting rubbery copolymer have a high glass transition point. The thermosetting resin composition in which such rubbery copolymer particles are used has poor rigidity. An amount greater than 80% by weight, on the other hand, retards the reaction rate during the emulsion polymerization, thus adversely affecting the productivity.

A preferable amount of Monomer II used for the preparation of rubbery copolymer particles of component (b) is 20-70% by weight, and more preferably 20-50% by weight, of the rubbery copolymer covering the seed particles. An amount smaller than 20% by weight retards the reaction rate during the emulsion polymerization and impairs the stability of the latex. If the amount of Monomer II is greater than 70% by weight, the resulting rubbery copolymer have a high glass transition point, which decreases the characteristics of the thermosetting resin composition; e.g., falling weight impact strength, low temperature impact strength, as well as other properties under normal conditions.

A preferable amount of Monomer III is 1-20% by weight of the rubbery copolymer covering the seed particles. An amount smaller than 1% by weight lowers the reactivity of the resulting the rubbery copolymer with thermosetting resins, leading to poor properties of the thermosetting resin composition. If the amount of Monomer III is greater than 20% by weight, the production of rubbery copolymer particles with a narrow particle size distribution within the average particle size of 0.2-1.0 $\mu$m, which is targeted by the present invention, is difficult.

The ratio by weight of the seed particles and the copolymer covering the seed particles in component (b) of the present invention is 30/70 to 70/30. Preparation of latex particles with a diameter smaller than 0.2 $\mu$m is difficult, if the proportion of the seed particles is less than 30% by weight. The proportion of the seed particles exceeding 70% by weight impairs the dispersion of rubbery copolymer particles in thermosetting resins.

Even though there are no restrictions to the molecular weight of component (b), the Mooney viscosity, $ML_{1+4}$ at 100° C., should preferably be in the range of 20 to 120 from the aspect of easiness in handling and moldability.

Either a batch process or a continuous process may be employed in the preparation of component (b). A batch process is preferred if the seed latex is prepared in the first step and subsequently copolymerization for the second step is effected by the addition of a monomer mixture to obtain a target latex. In this instance, the rubbery copolymer particles is coagulated by any conventional method, for example, by removing unreacted monomers and adding a prescribed amount of antioxidants and a coagulant, such as sodium chloride, aluminum sulfate, and calcium chloride. Another example of the coagulation method is adding a nonionic emulsifier to the latex and heating the mixture above the cloud point of the nonionic emulsifier (Japanese Patent Laid-open No. 160859/1990). This method is more preferable than the coagulation using a coagulating agent which is a metallic salt, in order to obtain a metal-free copolymer, which may exhibit superior electric insulation property and may be less corrosive.

For the preparation of the thermosetting resin composition according to the present invention, component (b) in an amount of 1–100 parts by weight, preferably 1–50 parts by weight, is blended with 100 parts by weight of component (a). No improvement in the flexibility and impact resistance is expected with the amount of component (b) less than 1 parts by weight; the amount of component (b) exceeding 100 parts by weight impairs superior electrical or mechanical properties inherently possessed by a thermosetting resin.

Blending of components (a) and (b) may be carried out by kneading using conventional closed type mixers, extruders, or rollers. In one of the preferred embodiments, component (a) as is or after made into a latex by emulsification with a surfactant and this latex is added to component (b) which is also in the form of latex, while forcibly mixing to provide a shear force. The methods of coagulation previously discussed for the coagulation of component (b) applies to the coagulation of the thermosetting resin composition thus obtained.

In the preparation of the thermosetting resin composition of this invention, components other than components (a) and (b) may optionally be added. Such optional components include resin hardeners, retarders, fillers (e.g., silica, clay, gypsum, calcium carbonate, quartz powder, talc, kaolin, mica, titanium compounds, antimony compounds), pigments, antioxidants, UV absorbers, waxes, and the like.

Other features of the invention will become apparent in the course of the following description of the exemplary embodiments which are given for illustration of the invention and are not intended to be limiting thereof.

EXAMPLES

In the examples below, all the designation of "part(s)" and "%" denote "parts by weight" and "% by weight", respectively.

EXAMPLE 1

(1) Preparation of Copolymer

The following components were subjected to emulsion polymerization in an autoclave at 60° C.

| | |
|---|---|
| Butadiene | 8 parts |
| Styrene | 11 parts |
| Methacrylic acid | 1 part |
| Water | 280 parts |
| Sodium dodecylbenzenesulfonate | 0.02 part |
| Potassium persulfate | 0.8 part |
| Dodecylmercaptan | 0.7 part |

When 95% of polymerization conversion was attained, the following monomers were added to the autoclave.

| | |
|---|---|
| Butadiene | 22 parts |
| Styrene | 10 parts |
| Methacrylic acid | 1 part |
| Potassium persulfate | 0.2 part |

When 95% of polymerization conversion was attained, the following monomers were further added to the autoclave to proceed with the polymerization using the polymers produced in the autoclave as a seed latex.

| | |
|---|---|
| Butadiene | 28 parts |
| Acrylonitrile | 12 parts |
| Methacrylic acid | 5 part |
| Divinylbenzene | 2 parts |
| Potassium persulfate | 0.1 part |

When 95% of polymerization conversion was attained, the polymerization reaction was terminated by an addition of 0.2 part of hydroxylamine sulfate per 100 parts of monomers. Unreacted monomers were recovered by steam distillation at about 70° C. under reduced pressure. The average particle size of the latex thus prepared was measured by a Coulter submicro particle analyzer (Model N-4 :trademark, manufactured by Nikkaki Co.) to confirm that the average particle size was 0.54 μm.

To 100 parts (as copolymer) of the latex thus obtained were added 8 parts of polyoxyethylene nonylphenyl ether (Emulgen 920: trademark, a product of Kao Corp.) and 1 part of an alkyl phenol, as an antioxidant, and the mixture was placed into a pressure tube and heated at 110° C. to obtain a coagulated copolymer which is in a form of fine crumbs. The fine crumbes of the copolymer collected by filtration were dehydrated and dried according to a conventional methods to obtain rubbery copolymer crumbes. The copolymer is herein referred to as "Copolymer I".

The average particle size, glass transition point (Tg), Mooney viscosity, and gel proportion of Copolymer I are shown in Table 1. The glass transition point (Tg) was determined by the DSC analysis.

(2) Evaluation of Thermosetting Resin Composition

An epoxy resin composition of the following formulation was prepared by using Copolymer I.

| | |
|---|---|
| Epoxy Resin (*1) | 100 parts |

-continued

| | |
|---|---|
| Novolac Resin (*2) | 50 parts |
| Copolymer I | 10 parts |
| α-Methylimidazole | 0.75 part |

(*1) SumiEpoxy ESCN 220L: trademark a product of Sumitomo Chemical Industry, Ltd.
(*2) Tamanol 758: trademark, a product of Arakawa Chemical Industry, Ltd.

The above components were kneaded in a closed type mixer at 80° C., pressmolded at 160° C., and milled to prepare test strips for testing impact resistance and bending strength. The bending strength was determined according to JIS K7203, and an Izod impact tester was used for the determination of impact resistance. The measurement was carried out by using test strips at room temperature without notches.

As an index for the processability of the kneaded material its fluidity was measured at 160° C. by a flow tester manufactured by Shimazu Manufacturing Co., Ltd. with a 1 mm$\phi$×2 mm die.

(3) Observation of Dispersion Particles

Ultra-thin test strips were cut out from the same strips as used for the measurement of the izod impact strength in (2) above by a Ultramicrotome. After dyeing these test strips with 1% aqueous solution of osmium tetraoxide, the average particle size of the dispersed particles was determined by a transmission electron microscope TEM-100 (trademark, manufactured by Nippon Electronic Co.). The results obtained in (2) and (3) are given in Table 2. An electron microscope photograph showing particle structures of Copolymer I is presented in FIG. 1.

EXAMPLES 2-4 AND COMPARATIVE EXAMPLES 1-7

Monomers with compositions listed in Table 1 were polymerized in the same manner as in Example 1 to prepare Copolymers II to XII, provided that for the preparation of Copolymers IV and VIII after the addition of 1 part of alkyl phenol as an antioxidant, the latex was charged into 1% aqueous solution of calcium chloride to salt out the copolymer, which was then washed and dried.

In Table 1, amounts (parts by weight) of monomers used in different steps are shown divided by a slash (/). Copolymers for which amounts of monomers are given divided by 3 or more slashes (Copolymers II, III, X, and XI) were prepared in 3 or more steps, wherein seed particles were prepared in the 1st and 2nd steps. The properties of Copolymer II-XII are also given in Table 1.

Thermosetting resin compositions were prepared in the same manner as in Example 1 by using Copolymers II-IV (Examples 2-4) and VI-XII (Comparative Examples 1-7). The compositions were evaluated according to the same methods as in Example 1. The results are presented in Table 2. In Comparative Example 5, test specimens could not be prepared, since Copolymer X and the thermosetting resin could not form a homogeneous mixture.

Table 2 demonstrates that the thermosetting resin compositions of the present invention possess both superior mechanical strength and excellent impact resistance, and, at the same time, exhibit superb moldability.

TABLE 2

| | Example | | | | Comparative Example | | | | | | |
|---|---|---|---|---|---|---|---|---|---|---|---|
| | 1 | 2 | 3 | 4 | 1 | 2 | 3 | 4 | 5 | 6 | 7 |
| Copolymer No. | I | II | III | IV | VI | VII | VIII | IX | X | XI | XII |
| Method of coagulation | Nonionic surfactant + Heating | " | " | CaCl$_2$ | Nonionic surfactant + Heating | " | CaCl$_2$ | Nonionic surfactant + Heating | CaCl$_2$ | " | " |
| <Properties> | | | | | | | | | | | |
| Bending Strength (kgf/cm$^2$) | 6.2 | 6.4 | 6.2 | 6.4 | 5.6 | 5.2 | 4.4 | 4.7 | — | 5.7 | 5.7 |
| Izod Impact Strength (kgf · cm/cm) | 7.9 | 7.6 | 7.4 | 7.7 | 7.2 | 6.9 | 5.7 | 5.3 | — | 5.8 | 5.8 |
| Fluidity (cc/sec) | 0.02 | 0.14 | 0.12 | 0.12 | 0.12 | 0.02 | 0.01 | 0.11 | — | <0.01 | <0.01 |
| Particle size of dispersion particles (angstrom) | 5400 | 6700 | 4100 | 3600 | 870 | 920 | 840 | 3500 | — | Several μm-10 μm | Several μm-10 μm |

TABLE 3

| | Example | | | | | Comparative Example | | | | | | |
|---|---|---|---|---|---|---|---|---|---|---|---|---|
| | 5 | 6 | 7 | 8 | 9 | 8 | 9 | 10 | 11 | 12 | 13 | 14 |
| Epoxy Resin Composition (parts by weight) | | | | | | | | | | | | |
| Epicoat 828 | 80 | 80 | 80 | 80 | 80 | 80 | 80 | 80 | 80 | 80 | 80 | 80 |
| Copolymer No. | I | II | III | IV | V | VI | VII | VIII | IX | X | XI | XII |
| Amount | 20 | 20 | 20 | 20 | 20 | 20 | 20 | 20 | 20 | 20 | 20 | 20 |
| Viscosity (CPS) | 51,000 | 47,000 | 64,000 | 62,000 | 56,000 | >2 × 10$^6$ | >2 × 10$^6$ | 6 × 10$^5$ | 54,000 | >2 × 10$^6$ | 4.5 × 10$^5$ | >2 × 10$^6$ |
| Particle Size of Dispersed Particles (angstrom) | 5,400 | 6,600 | 4,100 | 3,600 | 3,700 | 850 | 920 | 840 | 3,500 | Several μm-10 μm | Several μm-10 μm | Several μm-10 μm |
| Additive | 175 | 175 | 175 | 175 | 175 | 175 | 175 | 175 | 175 | 175 | 175 | 175 |
| Tensile Shear Strength | | | | | | | | | | | | |
| 23° C. (kg/cm$^2$) | 258 | 273 | 256 | 266 | 250 | 239 | 250 | 228 | 235 | 183 | 210 | 160 |
| 80° C. (kg/cm$^2$) | 155 | 158 | 150 | 165 | 139 | 138 | 146 | 134 | 140 | 109 | 121 | 104 |
| T-type Peeling Strength 23° C. (kg/25 mm) | 15 | 17 | 15 | 14 | 11 | 7 | 8 | 7 | 7 | 9 | 10 | 9 |
| Dupont Impact Test | 12 | 15 | 13 | 13 | 7 | 3 | 2 | 2 | 3 | 2 | 2 | 1 |

TABLE 3-continued

| | Example | | | | | Comparative Example | | | | | | |
|---|---|---|---|---|---|---|---|---|---|---|---|---|
| | 5 | 6 | 7 | 8 | 9 | 8 | 9 | 10 | 11 | 12 | 13 | 14 |
| 23° C. (time) | | | | | | | | | | | | |

EXAMPLE 5

In the following examples the epoxy resin compositions of the present invention were prepared and their characteristics as epoxy adhesives were evaluated.

The copolymer latex prepared in Example 1 (the latex for Copolymer I) was added to Epicoat 828 (trademark, epoxy resin manufactured by Yuka-Shell Epoxy Co.) in the proportion shown in Table 3. The mixture was kneaded at room temperature by a shearing stirrer (Homodisper: trademark, manufactured by Tokushukika Kogyo K.K.) for 20 minutes. After an addition of 0.1 part of triphenylphosphine, a preliminary reaction was effected at 90°-95° C. Water was removed from the reaction mixture at the same temperature under reduced pressure to obtain a rubber modified epoxy resin in which the rubbery copolymer is homogeneously dispersed. 100 parts by weight of the rubber modified epoxy resin and 10 parts by weight of triethylenetetramine were mixed and the resin was cured at 140° C. for 60 minutes. Ultra-thin test strips were prepared from the cured material in the same manner as in Example 1. The strips were dyed with osmium tetraoxide and observed by a transmission electron microscope to measure the average particle size of dispersed particles of Copolymer I.

An additive consisting of 100 parts by weight of AN-CAMINE (trademark, a product of ACI Japan Ltd, an epoxy adduct of isophorodiamine) as a curing agent, and 70 parts by weight of calcium carbonate and 5 parts by weight of silica, as fillers, was added to and blended with the rubber modified epoxy resin in a proportion shown in Table 3 to obtain a modified epoxy resin composition. The following adhesion properties of the composition were determined by using the composition as an adhesive and a cold-rolled steel plate with a thickness of 1.6 mm as an object to be adhered. The steel plate was polished with #240 sand paper and washed with trichloroethylene. The adhesive was cured after heating at 140° C. for 1 hour.

(a) Viscosity

The viscosity of the adhesive composition before hardening was measured at 25° C. by a BH type rotary viscometer.

(b) Tensile Shear Strength

JIS K6850 was followed at a drawing speed of 5 mm/min and a temperature of 23° C. and 80° C.

(c) T-type Peeling Strength

JIS K5854 was followed at a drawing speed of 50 mm/min and a temperature of 23° C.

(d) Impact Resistance

A cold-rolled steel plate, 100 mm×25 mm×3.2 mm, was used as an object to be adhered. The steel plate was treated in the same manner as mentioned above. The adhesive was applied to a 25 mm×25 mm area and cured at 140° C. for 60 minutes. A plumb weighing 500 gm was repeatedly dropped onto the adhered test steel plate from the height of 50 cm by using a Dupont type impact tester until the test plate was broken. The number of the time that the plumb was dropped before the test plates was broken was taken as the measure of the impact resistance.

The results are shown in Table 3.

EXAMPLES 6-9 AND COMPARATIVE EXAMPLES 8-14

Modified epoxy resin compositions (Examples 6-9 Comparative Examples 8-14) of the compositions shown in Table 3 were prepared and the adhesion characteristics were measured in the same manner as in Example 5. The results are shown in Table 3.

From the results given in Table 3 the compositions of the present invention were confirmed to have a low viscosity as an adhesive and to be easily applied to the objects to be adhered. Their adhesive strength, especially the peeling strength which is a property that is possessed insufficiently by conventional epoxy resin adhesives, was demonstrated to be outstanding. In addition, the adhered layers were proven to exhibit excellent impact resistance.

TABLE 1

| Copolymer No. | I | II | III | IV | V | VI | VII | VIII | IX | X | XI | XII |
|---|---|---|---|---|---|---|---|---|---|---|---|---|
| <Monomer Composition> | | | | | | | | | | | | |
| Butadiene | 8/22/28 | 8/20/18/10 | 8/22/15 | 33/29 | 24/36 | 58 | 45 | 60 | 24/0 | 8/22/30 | 8/22/29.7 | 33/29 |
| Acrylonitrile | 0/0/12 | 0/0/6/8 | 11/10/7 | 14/15 | 13/25 | 12 | 28 | 38 | 13/16 | 0/0/12 | 0/12 | 15/16 |
| Styrene | 11/10/0 | 11/10/0/0 | | | | 21 | | | | 11/10/0 | 11/10/0 | |
| Butyl acrylate | | | 0/0/10 | | | | 10 | | 20/0 | | | |
| Methacrylic acid | 1/1/5 | 1/1/2.5/2.5 | | 0/7 | | 7 | | | 0/7 | 1/1/5 | 1/1/5 | 0/7 |
| Glycidyl methacrylate | | | 0/2/3 | | | | | 5 | | | | |
| Divinylbenzene | 0/0/2 | 0/0/1/1 | | 1/1 | 0/2 | 2 | 2 | 2 | 1/1 | | 0/0/0.3 | |
| Ethylene glycol dimethacrylate | | | 0/0/2 | | | | | | | | | |
| Methyl methacrylate | | | | | | | | | 0/18 | | | |
| Average particle size of latex particles (angstrom) | 5,400 | 6,700 | 4,100 | 3,600 | 3,700 | 860 | 920 | 840 | 3,500 | 5,700 | 5,500 | 3,200 |
| Mooney viscosity $ML_{1+4}$ (100° C.) | 45 | 92 | 61 | 101 | 76 | 79 | 56 | 60 | 135 | 40 | 51 | 86 |
| Gel proportion (%) | 91 | 93 | 87 | 94 | 91 | 88 | 92 | 90 | 96 | 0 | 38 | 0 |
| Tg (°C.) | −12/ | −21/ | −2/ | −56/ | −39/ | −26 | −36 | −33 | −31/ | −12/ | −12/ | −56/ |

TABLE 1-continued

| Copolymer No. | I | II | III | IV | V | VI | VII | VIII | IX | X | XI | XII |
|---|---|---|---|---|---|---|---|---|---|---|---|---|
| | −38 | −43 | −37 | −9 | −20 | | | | +105 | −40 | −38 | −9 |

EXAMPLE 10

To 100 parts by weight of the copolymer latex prepared in Example 1 (the latex for Copolymer I) was added 1 part of alkyl phenol, as an antioxidant, and the latex was coagulated with an aqueous solution of calcium chloride. The coagulated copolymer was subjected to centrifugation to dehydrate and to obtain a material with water content of about 40%. This material was dried in a hot air drier at 90° C. for 2 hours to obtain a crumb-like dried polymer. 20 parts by weight of the crumb-like polymer was added to 80 parts by weight of Epicoat 828, and the mixture was stirred at a high speed by Homodisperser (trademark, manufactured by Tokushukikakogyo K.K.) for 60 minutes to obtain completely uniform mixture with a viscosity of 55,000 CPS. Electron microscopic observation revealed that the rubbery copolymer particles had an average particle size of 5,400 angstroms.

The same curing agent and fillers as used in Example 5 were added to the modified epoxy resin composition to evaluate its performance as an adhesive in the same manner as in Example 5.

| Tensile Shear Strength | |
|---|---|
| 23° C. (kg/cm$^2$) | 265 |
| 80° C. (kg/cm$^2$) | 161 |
| T-type Peeling Strength 23° C. (kg/25 mm) | 15 |
| Dupont Impact Test 23° C. (time) | 13 |

COMPARATIVE EXAMPLE 15

(1) Preparation of Copolymer XIII

The following components were subjected to emulsion polymerization in an autoclave at 60° C.

| Butadiene | 53 parts |
|---|---|
| Styrene | 5 parts |
| Acrylonitrile | 2 parts |
| Water | 280 parts |
| Sodium dodecylbenzenesulfonate | 3 parts |
| Potassium persulfate | 0.8 part |
| Dodecylmercaptan | 0.2 part |

The reaction was terminated when 95% of polymerization conversion was attained. The latex thus obtained had an average particle size of 920 angstroms. 82% of the polymer was insoluble in toluene. Next, the following monomers were added to the autoclave.

| Ethyl acrylate | 35 parts |
|---|---|
| Methacrylic acid | 5 parts |
| Potassium persulfate | 0.3 part |

The temperature was raised to 60° C. to continue the polymerization reaction until 95% of polymerization conversion was achieved with respect to the added monomers. A polymer latex was prepared in the same manner as in Example 1 from the product. The latex was confirmed to have an average particle size of 1,400 angstroms and Tg of −72° C./−10° C. To 100 parts by weight of the copolymer latex was added 1 part of alkyl phenol, as an antioxidant, and the latex was coagulated with an aqueous solution of calcium chloride. The coagulated copolymer was dried at 90° C. for 2 hours to obtain a crumb-like dried polymer.

(2) Evaluation of Copolymer XIII

The preparation of an epoxy adhesive according to the procedure of Example 10 was repeated with respect to the composition in which Copolymer XIII was used. A mixture of Copolymer XIII and Epicoat 828 was stirred at a high speed by Homodisperser for 180 minutes, resulting an unhomogeneous epoxy resin composition with a number of lumps of Copolymer XIII.

COMPARATIVE EXAMPLE 16

(1) Preparation of Copolymer XIV

The emulsion polymerization in an autoclave was carried out in the same manner as in Comparative Example 15, except that sodium dodecylbenzenesulfonate was added in an amount of 0.05 part instead of 3.0 parts. The latex thus obtained had an average particle size of 2,800 angstroms and Tg of −72° C./−10° C. A crumb-like dried polymer was obtained from the latex in the same manner as in Comparative Example 15.

(2) Evaluation of Copolymer XIV

The preparation of an epoxy adhesive according to the procedure of Example 10 was repeated with respect to the composition in which Copolymer XIV was used. A mixture of Copolymer XIV and Epicoat 828 was stirred at a high speed by Homodisperser for 180 minutes, failing to obtain a homogeneous epoxy resin composition.

COMPARATIVE EXAMPLE 17

(1) Preparation of Copolymer XV

The following components were subjected to emulsion polymerization in an autoclave at 60° C.

| Butadiene | 53 parts |
|---|---|
| Styrene | 5 parts |
| Acrylonitrile | 2 parts |
| Water | 280 parts |
| Sodium dodecylbenzenesulfonate | 1.5 parts |
| Potassium persulfate | 0.8 part |
| Dodecylmercaptan | 0.2 part |

The reaction was terminated when 95% of polymerization conversion was attained. The latex thus obtained had an average particle size of 1,200 angstrome. 84% of the polymer was insoluble in toluene. Next, the following monomers were added to the autoclave.

| Styrene | 24 parts |
|---|---|
| Acrylonitrile | 10 parts |
| Glycidyl methacrylate | 6 parts |
| Potassium persulfate | 0.3 part |

The temperature was raised to 60° C. to continue the polymerization reaction until 95% of polymerization conversion was achieved with respect to the added monomers. The latex thus prepared was confirmed to have an average particle size of 1,360 angstrome and Tg of −70° C./+102° C. A crumb-like dried polymer was obtained from the latex in the same manner as in Comparative Example 10.

(2) Evaluation of Copolymer XV

A thermosetting resin composition was prepared and evaluated in the same manner as in Example 1 by using Copolymer XV. Particles of Copolymer XV were not partly well dispersed. The properties of the composition were as follows.

| Bending Strength (kgf/cm²) | 4.2 |
| Izot Impact Strength (kgf · cm/cm) | 4.8 |
| Fluidity (cc/sec) | 0.08 |
| Particle size of the dispersion particles (angstrome) | 1,210 |

COMPARATIVE EXAMPLE 18

An epoxy adhesive was prepared by using the dried crumb of Copolymer XV prepared in Comparative Example 17 and evaluated in the same manner as Example 10. A homogeneous composition was obtained from a mixture of Copolymer XV and Epicoat 828 with stirring for 180 minutes, but not for 60 minutes.

The composition obtained had a viscosity of 61,000 CPS and the rubbery copolymer particles contained therein had an average particle size of 1,240 angstrome. Its properties as an adhesive were as follows.

| Tensile Shear Strength | |
| --- | --- |
| 23° C. (kg/cm²) | 255 |
| 80° C. (kg/cm²) | 151 |
| T-type Peeling Strength 23° C. (kg/25 mm) | 7 |
| Dupont Impact Test 23° C. (time) | 3 |

As discussed above, the thermosetting resin composition of the present invention can easily be processed and possesses excellent impact resistance, mechanical strength, and adhesive strength. It can be used with advantage as a sealing material of semiconductors, an adhesive for various materials (e.g. print circuit boards), a molding material, a paint, and a lining material.

Obviously, numerous modifications and variations of the present invention are possible in light of the above teachings. It is therefore to be understood that within the scope of the appended claims, the invention may be practiced otherwise than as specifically described herein.

What is claimed is:

1. A thermosetting resin composition comprising: (a) 100 parts by weight of a thermosetting resin and (b) 1–100 parts by weight of a rubbery copolymer, said rubbery copolymer comprising a plurality of seed particles and a covering copolymer covering said seed particles, said seed particles comprising at least one polymer having a glass transition point of 25° C. or lower, said rubbery copolymer being prepared from said seed particles and a monomer mixture to produce said covering copolymer having a glass transition point of −20° C. or lower, said monomer mixture comprising at least one crosslinking monomer having at least two unsaturated bonds and at least one conjugated diene, all rubbery copolymer having an average particle size of 0.2–1.0 μm, and said rubbery copolymer having a gel proportion of 50% by weight or more.

2. A thermosetting resin composition according to claim 1, wherein said at least one polymer is prepared from at least one monomer selected from the group consisting of conjugated dienes; unsaturated compounds, other than conjugated dienes or crosslinking monomers, which do not have functional groups; unsaturated compounds which have functional groups; and a mixture of said at least one monomer and at least one crosslinking monomer.

3. A thermosetting resin composition according to claim 1, wherein said at least one polymer is prepared from at least one conjugated diene, or a monomer mixture containing at least one conjugated diene.

4. A thermosetting resin composition according to claim 1, wherein said at least one crosslinking monomer is present in 0.5–5 parts by weight for 100 parts by weight of said copolymer covering said seed particles.

5. A thermosetting resin composition according to claim 1, wherein the amount of said at least one conjugated diene comprises 30–80% by weight of said copolymer covering said seed particles.

6. A thermosetting resin composition according to claim 1, wherein said at least one polymer has a glass transition point of 0° C. or lower.

7. A process for preparation of a thermosetting resin composition comprising:
providing (a) at least one thermosetting resin, and (b) a rubbery copolymer, said rubbery copolymer comprising a plurality of seed particles and a covering copolymer covering said seed particles, said seed particles comprising at least one polymer having a glass transition point of 25° C. or lower, said rubbery copolymer being prepared from said seed polymer particles and a monomer mixture to produce said covering copolymer having a glass transition point of −20° C. or lower and comprising at least one crosslinking monomer having at least two unsaturated bonds and at least one conjugated diene, all rubbery copolymer having an average particle size of 0.2–1.0 μm, and said rubbery copolymer having a gel proportion of 50% by weight or more, and
making a combination by adding 1–100 parts by weight of said rubbery copolymer (b) to 100 parts by weight of said thermosetting resin (a) while providing a shear force to said combination.

* * * * *